United States Patent [19]

Tanaka et al.

[11] Patent Number: 5,445,896
[45] Date of Patent: Aug. 29, 1995

[54] SLIDING BEARING MATERIAL INCLUDING OVERLAY HAVING EXCELLENT ANTI-SEIZURE PROPERTY

[75] Inventors: Tadashi Tanaka, Konan; Masaaki Sakamoto, Nagoya; Hideyuki Kidokoro, Komaki, all of Japan

[73] Assignee: Daido Metal Company Ltd., Nagoya, Japan

[21] Appl. No.: 305,982

[22] Filed: Sep. 19, 1994

Related U.S. Application Data

[63] Continuation of Ser. No. 118,187, Sep. 9, 1993, abandoned.

[30] Foreign Application Priority Data

Sep. 28, 1992 [JP] Japan ................................. 4-257087

[51] Int. Cl.$^6$ ............................................. F16C 33/12
[52] U.S. Cl. .................................... 428/647; 428/648; 428/650; 428/653; 428/654; 428/675; 428/677; 384/912
[58] Field of Search ............... 428/650, 652, 653, 654, 428/677, 675, 658, 648, 647; 384/912

[56] References Cited

U.S. PATENT DOCUMENTS

| | | | |
|---|---|---|---|
| 3,985,407 | 10/1976 | Oliver et al. | 428/652 |
| 4,170,469 | 10/1979 | Mori | 428/652 |
| 4,188,079 | 2/1980 | Mori | 428/654 |
| 4,189,525 | 2/1980 | Mori | 428/654 |
| 4,645,360 | 2/1987 | Eastwood et al. | 384/912 |
| 4,696,867 | 9/1987 | Eastwood | 428/650 |
| 5,045,405 | 9/1991 | Koroschetz et al. | 428/653 |
| 5,112,416 | 5/1992 | Tanaka et al. | 384/912 |
| 5,162,100 | 11/1992 | Tanaka et al. | 428/650 |
| 5,362,574 | 11/1994 | Tanaka et al. | 428/654 |

FOREIGN PATENT DOCUMENTS 706672 3/1954 United Kingdom .
2182348 5/1987 United Kingdom .

*Primary Examiner*—John Zimmerman
*Attorney, Agent, or Firm*—Browdy and Neimark

[57] ABSTRACT

A sliding bearing material of a three-layer structure includes a back steel layer, a bearing alloy layer, and an overlay formed by sputtering. The overlay has an excellent anti-seizure property, and the overlay contains, by weight, 10–80% Sn, 0.1–5% Cu, 0.05–3% Sb, and the balance Al. Optionally, the overlay may further contain not more than 10% of one or both of Pb and Bi. Also, optionally, the overlay may further contain not more than 5% Si.

12 Claims, No Drawings

SLIDING BEARING MATERIAL INCLUDING OVERLAY HAVING EXCELLENT ANTI-SEIZURE PROPERTY

This application is a continuation of application Ser. No. 08/118,187, filed Sep. 9, 1993 now abandoned.

BACKGROUND OF THE INVENTION

This invention relates to an improvement in an overlay of a sliding bearing, and more particularly to a sliding bearing material including an overlay having an excellent anti-seizure property suited for a high power design of an internal combustion engine used in an automobile, ship and industrial machinery.

Recently, internal combustion engines have increasingly had a high power design as well as a high speed design, and to meet this, an overlay has been formed by electroplating on a bearing alloy to improve surface properties such as conformability, embeddability and anti-seizure property. Recently, it has also been proposed to form an overlay by sputtering to enhance an anti-seizure property, wear resistance and corrosion resistance to thereby improve the performance of the bearing.

Examples of overlays formed by electroplating include a Pb-Sn alloy, a Pb-In-Sn alloy and a Pb-Sn-Cu alloy. These are a Pb alloy, and therefore are soft, and excellent in conformability, embeddability and anti-seizure property, but are inferior in fatigue resistance and wear resistance. Recently, internal combustion engines have been designed to produce an increased power for achieving a high performance and energy saving, and have had a compact design, so that the width of a bearing is reduced, and a bearing pressure acting on the bearing has become larger and larger. As a result, a conventional bearing has become unsuitable for the recent high power design of internal combustion engines. Furthermore, in the case of the electroplating, enormous costs have been required for disposing of waste liquids.

In order to solve the above problems, it has been proposed to form an overlay of an Al-20Sn alloy by sputtering to improve fatigue resistance, wear resistance and corrosion resistance; however, this overlay is high in hardness, and therefore is inferior in anti-seizure property.

SUMMARY OF THE INVENTION

Attention has been directed to a sputtering technique in order to enhance the strength of an overlay, such as fatigue resistance and wear resistance. With this sputtering method, a thin layer can be easily vapor-deposited on a substrate in a vacuum by forming a target of a required composition. Therefore, an overlay of an aluminum alloy which has been difficult to be produced by electroplating can be easily provided by sputtering. Argon ions impinge on the target, and the components of the target expelled by the impingement energy impinge on the substrate to deposit thereon. Therefore, the overlay having a composition analogous to that of the target can be obtained, but the overlay has a very fine (in crystal grain size) and uniform structure, and is very hard, as compared with the target. This fine and uniform structure and the high hardness enhance the strength of the overlay such as fatigue resistance and wear resistance. The present invention is aimed at improving the composition of the target in order to further enhance the anti-seizure property of the overlay.

According to the present invention, there is provided a sliding bearing material comprising a back steel layer, a bearing alloy layer, and an overlay formed by sputtering, the overlay having an excellent anti-seizure property, and the overlay comprising, by weight, 10-80% Sn, 0.1-5% Cu, 0.05-3% Sb, and the balance Al and incidental impurities.

The overlay may further contain not more than 10% of one or both of Pb and Bi.

Also, the overlay may further contain not more than 5% Si.

The reasons for specifying the composition of the overlay of the present invention as disclosed above, as well as effects thereof, will be explained below.

(1) Balance Al

This substance has excellent corrosion resistance and strength, and when this substance is used in combination with the elements enumerated in the following Items (2) to (7), it forms, together with these elements, the overlay alloy excellent in fatigue resistance, wear resistance, load-carrying capacity and anti-seizure property.

(2) Sn: 10–80% wt. %

The addition of this substance improves surface properties of the overlay such as conformability, embeddability, anti-seizure property. If the content of this substance is less than 10%, a satisfactory effect is not obtained. In contrast, if this content is more than 80%, mechanical properties of the overlay are adversely affected greatly.

(3) Cu: 0.1–5 wt. %

This substance serves to improve the mechanical strength of the Al matrix to enhance mechanical properties of the overlay such as fatigue resistance, wear resistance and load-carrying capacity. If the content of this substance is less than 0.1%, a satisfactory effect is not obtained. In contrast, if this content is more than 5%, the overlay becomes extremely brittle to lower the fatigue strength of the overlay.

(4) Sb: 0.05–3 wt. %

This substance serves to improve the mechanical strength of the Al matrix to improve mechanical properties of the overlay such as fatigue resistance, wear resistance and load-carrying capacity. This substance also serves to disperse Pb (later explained) finely and uniformly in the Al alloy, and therefore a target having Pb dispersed finely and uniformly therein can be easily produced, and hence the overlay of a uniform structure can be obtained. If the content of this substance is less than 0.05%, a satisfactory effect is not obtained. In contrast, if this content is more than 3%, the overlay becomes brittle to degrade the bearing performance, though the hardness of the overlay is increased.

(5) Pb: 0–10 wt. %

This substance improves a lipophilic property and an anti-seizure property. If the content of this substance is more than 10%, it becomes very difficult to disperse this substance finely and uniformly in the Al-matrix, and therefore it becomes difficult to produce a target having Pb dispersed therein finely and uniformly.

(6) Bi: 0–10 wt. %

This substance is alloyed with Sn to improve a lubricating property and conformability of Sn, thereby further enhancing the anti-seizure property. If the content of this substance is more than 10%, a melting point of the overlay is lowered to decrease the fatigue strength.

(7) Si: 0.5–5 wt. %

This substance is used to improve an anti-creep property of the Al matrix and an anti-seizure property. If the content of this substance is less than 0.1%, a satisfactory effect is not obtained. In contrast, if this content is more than 5%, the overlay becomes brittle to degrade the bearing performance.

It is advantageous that the thickness of the overlay be 5-30 μm.

The composition of the intermediate layer provided between the overlay and the bearing alloy layer, as well as effects thereof, will be explained below (1) Intermediate layer of Zn or Zn alloy When the overlay is to be bonded by sputtering onto the bearing alloy layer of an Al alloy, a strong oxide film must first be removed from the surface of the Al alloy. For this purpose, the surface of the Al alloy bearing layer is subjected to a zincating treatment in a wet bath as in electroplating, so that the strong oxide film on the surface is replaced by Zn or a Zn alloy. Then, the overlay is vapor-deposited thereon, thereby achieving a stronger bonding.

It is advantageous that the thickness of the intermediate layer be 0.5 to 3 μm.

(2) Intermediate layer of Ni or Ni alloy

When a Cu alloy is used as the bearing alloy, and an alloy containing Sn is used as the overlay, Sn diffuses into the Cu alloy with the lapse of time to decrease the Sn content of the overlay, and at the same time a brittle CuSu compound is produced at the bonding surface, thereby lowering the bonding strength. In view of this, the intermediate layer of Ni or a Ni alloy is formed on the bearing alloy by sputtering or electroplating, and then the overlay is vapor-deposited thereon, thereby achieving a more stable bonding. It is advantageous that the thickness of the intermediate layer be 1-3 μm. The thickness of the bearing alloy layer is 0.2-1.5 mm. Preferably, the bearing alloy layer is any one of a Cu-20-35%Pb-0-2%Sn alloy, a Cu-5-25%Pb-2-12%Sn alloy, an Al-5-60%Sn-2-8%Si-0.2-2%Cu-0-2%Pb alloy and an Al-5-20%Pb-2-10%Sn-0.2-2%Cu-0-4%Si-0-1%Mn alloy.

DESCRIPTION OF THE INVENTION

The present invention will now be illustrated more specifically by way of the following Example.

EXAMPLE

Table 1 shows the compositions of various overlays, various intermediate layers and various bearing alloy layers used for bearing metals of the present invention. Table 1 also shows the hardness of the various overlays and results of seizure tests.

Targets, composed respectively of aluminum alloys respectively having the same compositions as those of the overlays shown in Table 1, were prepared by casting. Then, a powder having the composition of each of the bearing alloy layers of a copper alloy shown in Table 1 was sintered onto a back steel, and was joined by rolling to the back steel to form a bimetal. Then, the bimetal was machined into a bearing metal, and a film of Ni with a thickness of 2 μm, serving as an intermediate layer, was deposited on the bearing metal by electroplating. This intermediate layer may be formed by sputtering Ni or a Ni alloy. Then, each of the bearing metal with the Ni-plating layer and the bearing metal without the Ni-plating film was attached to a sputtering jig, and then was placed in a chamber. Then, the chamber was evacuated, and then argon was introduced into the chamber, and an ion bombardment was carried out to clean the surface of the bearing metal. Thereafter, sputtering was carried out, using each of the above aluminum alloy targets. In this manner, each of the various overlays, having their respective compositions shown in Table 1, was deposited on the bearing metal, the thickness of the overlay being 15 μm.

Next, an aluminum alloy having composition of each of the bearing alloy layers shown in Table 1 were cast onto a back steel, and were joined by rolling to the back steel to form a bimetal. Then, the bimetal was machined into a bearing metal, and then a zincating treatment was applied to the bearing metal, so that an oxide film on the aluminum surface was replaced by a Zn film having a thickness of 0.5 μm, this Zn film serving as an intermediate layer. Then, according to the same procedure as described above, each of the various overlays, having their respective compositions shown in Table 1, was deposited on each of both the bearing metal whose oxide film had been replaced by Zn and the bearing metal whose oxide film had not been replaced by Zn, the thickness of the overlay being 10 μm.

The hardness of the surface of the overlay of each of the thus prepared bearing metals was measured by a micro Vickers hardness meter, applying a load of 10 grams thereto. Then, seizure tests were conducted under the conditions shown in Table 2.

As indicated in Table 1, the products of the present invention exhibit an excellent anti-seizure property, as compared to comparative products.

(1) By adding Sb to Al-Sn-Cu or Al-Sn-Cu-Pb used as the overlay, the anti-seizure property is enhanced with respect to either of the copper alloy and the aluminum alloy both used as the underlying layer (bearing layer) regardless of whether or not the intermediate layer is provided.

(2) By adding Pb and/or Bi to the composition of the overlay, the anti-seizure property is further enhanced.

(3) By adding Si to the composition of the overlay, the anti-seizure property is further enhanced.

(4) As described above, the products of the present invention have excellent fatigue resistance, wear resistance and corrosion resistance which are features of the overlay formed by sputtering, and besides the anti-seizure property is improved. Therefore, the products of the present invention can be suitably used as a sliding bearing material suited for use in an internal combustion engine of a high-power design.

TABLE 1

| KIND | NO. | COMPOSITION OF OVERLAY (WT. %) | | | | | | | INTER-MEDIATE LAYER | COMPOSITION OF ALLOY LAYER (WT. %) | | | | | | HARDNESS OF OVERLAY (Hv) | MAXIMUM BEARING PRESSURE NOT CAUSING SEIZURE Kg/cm² |
|---|---|---|---|---|---|---|---|---|---|---|---|---|---|---|---|---|---|
| | | Al | Sn | Cu | Sb | Pb | Bi | Si | | Cu | Pb | Sn | Al | Zn | Si | | |
| COMPARATIVE PRODUCTS | 1 | Balance | 20 | 1 | | | | | Ni | Balance | 17 | 3 | | | | 105 | 800 |
| | 2 | Balance | 20 | 1 | | | | | Zn | 1 | 1 | | Balance | 4 | 5 | 100 | 750 |
| | 3 | Balance | 20 | 1 | | 2 | | | Ni | Balance | 17 | 3 | | | | 102 | 850 |
| | 4 | Balance | 20 | 1 | | 2 | | | Zn | 1 | 1 | | Balance | 4 | 5 | 97 | 800 |
| | 5 | Balance | 20 | 1 | 0.5 | | | | Ni | Balance | 17 | 3 | | | | 110 | 950 |
| | 6 | | | | | | | | None | 1 | 1 | | Balance | 4 | 5 | 106 | 900 |
| | 7 | | | | | | | | Zn | 1 | 1 | | | | | 105 | 900 |
| | 8 | | | | | | | | None | | | | | | | 105 | 1,000 |
| PRODUCTS OF INVENTION | 9 | Balance | 20 | 1 | 0.5 | 2 | | | Ni | Balance | 17 | 3 | | | | 88 | 1,050 |
| | 10 | Balance | 40 | 1 | 0.5 | 5 | | | Zn | 1 | 1 | | Balance | 4 | 5 | 87 | 1,100 |
| | 11 | Balance | 40 | 1 | 0.5 | 5 | | | Ni | Balance | 17 | 3 | | | | 71 | 1,250 |
| | 12 | Balance | 40 | 1 | 0.5 | 5 | | | Zn | 1 | 1 | | Balance | 4 | 5 | 66 | 1,250 |
| | 13 | Balance | 40 | 1 | 0.5 | 2.5 | 2.5 | | Ni | Balance | 17 | 3 | | | | 68 | 1,300 |
| | 14 | Balance | 40 | 1 | 0.5 | 2.5 | 2.5 | | Zn | 1 | 1 | | Balance | 4 | 5 | 65 | 1,200 |
| | 15 | Balance | 40 | 1 | 0.5 | 2.5 | 2.5 | | Ni | Balance | 17 | 3 | | | | 64 | 1,350 |
| | 16 | | | | | | | | Zn | 1 | 1 | | Balance | 4 | 5 | 63 | 1,300 |
| | 17 | | | | | | | | None | | | | | | | 63 | 1,300 |
| | 18 | | | | | | | | None | | | | | | | 65 | 1,300 |
| | 19 | Balance | 20 | 1 | 0.5 | | | 2.5 | Ni | Balance | 17 | 3 | | | | 103 | 1,050 |
| | 20 | Balance | 20 | 1 | 0.5 | | | 2.5 | Zn | 1 | 1 | | Balance | 4 | 5 | 99 | 1,100 |
| | 21 | Balance | 40 | 1 | 0.5 | 2.5 | 2.5 | 2.5 | Ni | Balance | 17 | 3 | | | | 79 | 1,250 |
| | 22 | Balance | 40 | 1 | 0.5 | 2.5 | 2.5 | 2.5 | Zn | 1 | 1 | | Balance | 4 | 5 | 77 | 1,200 |
| | 23 | Balance | 60 | 1 | 0.5 | | | | Ni | Balance | 17 | 3 | | | | 58 | 1,250 |
| | 24 | Balance | 60 | 1 | 0.5 | | | | Zn | 1 | 1 | | Balance | 4 | 5 | 55 | 1,250 |

TABLE 2

| Conditions of Seizure Test Static load test machine | | |
|---|---|---|
| Item | Dimensions | Unit |
| Inner diameter, length, and thickness of bearing | φ53 × 113 × t1.5 | mm |
| Rotational speed | 3600 | rpm |
| Circumferential speed | 10.0 | m/s |
| Lubricating oil | SAE20 | — |
| Lubricating oil temperature | 98–102 | °C. |
| Oil feed rate | 12.5 | CC/min |
| Shaft material | S55C | — |
| Roughness of shaft | 1.0 > | Rmax μm |

Test method
* Set-up method in which the load is increased by 50 kgf/cm$^2$ every 10 minutes.
Evaluation method
* It is decided that seizure is encountered either when the temperature of the back surface of the bearing exceeds 200° C., or when the value of electric current exceeds 20A.

What is claimed is:

1. A sliding bearing material comprising a back steel layer, a bearing alloy layer selected from the group consisting of a Cu-20 to 35% Pb-0 to 2% Sn alloy, a Cu-5 to 25% Pb-2 to 12% Sn alloy, an Al-5 to 60% Sn-2 to 8% Si-0.2 to 2% Cu-0 to 2% Pb alloy, an Al-5 to 20% Pb-2 to 10% Sn-0.2 to 2% Cu-0 to 4% Si-0 to 1 Mn alloy, and an Al-4% Zn-5% Si-1% Cu-1% Pb alloy, and an overlay formed by sputtering and having a thickness of 5 to 30 μm, said overlay having an excellent anti-seizure property, and said overlay consisting of, by weight, 10–80% Sn, 0.1–5% Cu, 0.05–3% Sb, and the balance Al and incidental impurities.

2. A sliding bearing material according to claim 1 wherein said bearing alloy layer comprises an Al alloy, and said sliding bearing material further comprises an intermediate layer formed between said bearing alloy layer and said overlay, said intermediate layer being composed of Zn or a Zn alloy.

3. A sliding material according to claim 2 wherein said intermediate layer has a thickness of 0.5 to 3 μm.

4. A sliding bearing material according to claim 1 wherein said bearing alloy layer comprises a Cu alloy, said sliding bearing material further comprising an intermediate layer formed between said bearing layer and said overlay, said intermediate layer being composed of Ni or a Ni alloy.

5. A sliding bearing material according to claim 4 wherein the thickness of said intermediate layer is 1 to 3 μm.

6. A sliding bearing material according to claim 1 wherein said bearing layer is an alloy of Al-4% Zn-5% Si-1% Cu-1% Pb.

7. A sliding bearing material comprising a back steel layer, a bearing alloy layer selected from the group consisting of a Cu-20 to 35% Pb-0 to 2% Sn alloy, a Cu-5 to 25% Pb-2 to 12% Sn alloy, an Al-5 to 60% Sn-2 to 8% Si-0.2 to 2% Cu-0 to 2% Pb alloy, an Al-5 to 20% Pb-2 to 10% Sn-0.2 to 2% Cu-0 to 4% Si-0 to 1 Mn alloy, and an Al-4% Zn-5% Si-1% Cu-1% Pb alloy., and an overlay formed by sputtering and having a thickness of 5-30 μm, said overlay having an excellent anti-seizure property, and said overlay consisting of, by weight, 10–80% Sn, 0.1–5% Cu, 0.05–3% Sb, at least one element selected from the group consisting of Pb and Bi in an amount not greater than 10%, and the balance Al and incidental impurities.

8. A sliding bearing material according to claim 7 wherein said bearing layer is an alloy of Al-4% Zn-5% Si-1% Cu-1% Pb.

9. A sliding bearing material comprising a back steel layer, a bearing alloy layer selected from the group consisting of a Cu-20 to 35%Pb 0 to 2% Sn alloy, a Cu-5 to 25% Pb-2 to 12% Sn alloy, an Al-5 to 60% Sn-2 to 8% Si-0.2 to 2% Cu-0 to 2% Pb alloy, an Al-5 to 20% Pb-2 to 10% Sn-0.2 to 2% Cu-0 to 4% Si-0 to 1 Mn alloy, and an Al-4% Zn-5% Si-1% Cu-1% Pb alloy, and an overlay formed by sputtering and having a thickness of 5-30 μm, said overlay having an excellent anti-seizure property, and said overlay consisting of, by weight, 10–80% Sn, 0.1–5% Cu, 0.05–3% Sb, 0.1–5% Si, and the balance Al and incidental impurities.

10. A sliding bearing material according to claim 9 wherein said bearing layer is an alloy of Al-4% Zn-5% Si-1% Cu-1% Pb.

11. A sliding bearing material comprising a back steel layer, a bearing alloy layer selected from the group consisting of a Cu-20 to 35% Pb-0 to 2% Sn alloy, a Cu-5 to 25% Pb-2 to 12% Sn alloy, an Al-5 to 60% Sn-2 to 8% Si-0.2 to 2% Cu-0 to 2% Pb alloy, an Al-5 to 20% Pb-2 to 10% Sn-0.2 to 2% Cu-0 to 4% Si-0 to 1 Mn alloy, and an Al-4% Zn-5% Si-1% Cu-1% Pb alloy, and an overlay formed by sputtering and having a thickness of 5-30 μm, said overlay having an excellent anti-seizure property, and said overlay consisting of, by weight, 10–80% Sn, 0.1–5% Cu, 0.05–3% Sb, 0.1–5% Si, at least one element selected from the group consisting of Pb and Bi in an amount not greater than 10%, and the balance Al and incidental impurities.

12. A sliding bearing material according to claim 11 wherein said bearing layer is an alloy of Al-4% Zn-5% Si-1% Cu-1% Pb.

* * * * *